United States Patent [19]

Frenette et al.

[11] Patent Number: 5,770,490

[45] Date of Patent: Jun. 23, 1998

[54] METHOD FOR PRODUCING DUAL WORK FUNCTION CMOS DEVICE

[75] Inventors: Robert O. Frenette, Burlington; Dale P. Hallock, Bristol; Stephen A. Mongeon, Essex Junction, all of Vt.; Anthony C. Speranza, Austin, Tex.; William R. P. Tonti, Essex Junction, Vt.

[73] Assignee: International Business Machines Corporation, Armonk, N.Y.

[21] Appl. No.: 705,579

[22] Filed: Aug. 29, 1996

[51] Int. Cl.⁶ .............................................. H01L 21/8238
[52] U.S. Cl. ........................ 438/199; 438/548; 438/563; 438/564; 438/168; 438/216; 438/312; 438/324
[58] Field of Search .................................. 438/199, 563, 438/564, 548, 168, 216, 312, 324

[56] References Cited

U.S. PATENT DOCUMENTS

| | | |
|---|---|---|
| 4,755,478 | 7/1988 | Abernathe et al. . |
| 5,190,888 | 3/1993 | Schwalke et al. . |
| 5,329,138 | 7/1994 | Mitani et al. . |
| 5,464,789 | 11/1995 | Saito . |
| 5,465,000 | 11/1995 | Williams . |

FOREIGN PATENT DOCUMENTS

| | | | |
|---|---|---|---|
| 58-197072 | 5/1985 | Japan . | |
| 0104325 | 5/1988 | Japan | 437/164 |
| 0188913 | 7/1990 | Japan | 437/164 |
| 0188914 | 7/1990 | Japan | 437/56 |
| 404092416 | 5/1992 | Japan | 437/57 |

OTHER PUBLICATIONS

IBM Technical Disclosure Bulletin\vol. 31 No. 7\Dec. 1988\Dual Work Function Doping.
IBM Technical Disclosure Bulletin\Vo.26 No. 10A\Mar. 1984\Oxidizable P–Channel Gate Electrode.
Dialog 1996 Derwent Info. Ltd.\Mar. 1996\p. 2\JP 6283725.
BU889–0198\Low Reistivity Stack for Dual Doped Polysilicon Gate Electrode\Jun. 1991. No. 326\Kenneth Mason Publications Ltd., England.

*Primary Examiner*—John Niebling
*Assistant Examiner*—Long Pham
*Attorney, Agent, or Firm*—Schmeiser, Olsen & Watts; Howard J. Walter, Jr.

[57] ABSTRACT

A dual work function CMOS device and method for producing the same is disclosed. The method includes: depositing a first layer of a doped material, either n-type or p-type, over a substrate to be doped; defining the areas that are to be oppositely doped; depositing a second layer of an oppositely doped material over the entire surface; and subjecting the entire CMOS device to a high temperature, drive-in anneal. The drive-in anneal accelerates the diffusion of the dopants into the adjacent areas, thereby doping the gate polysilicon and channels with the desired dopants. A nitride barrier layer may be utilized to prevent the second dopant from diffusing through the first layer and into the substrate beneath.

13 Claims, 2 Drawing Sheets

METHOD FOR PRODUCING DUAL WORK FUNCTION CMOS DEVICE

BACKGROUND OF THE INVENTION

1. Technical Field

This invention relates generally to a method of manufacturing integrated circuit (IC) chips and the IC chips produced thereby. More specifically, the present invention relates to a dual work function complementary metal oxide semiconductor (CMOS) device and a method for producing these devices.

2. Background Art

Presently, integrated circuit chips are manufactured by beginning with a wafer. If desired, these wafers may be grown with a given type of impurity, depending upon whether one desires electron acceptors (p-type impurities) or electron donors (n-type impurities) in the wafer.

One of the first processing steps of the wafer in forming an integrated circuit (IC) chip is the creation of device isolation. Shallow trench isolation areas may be formed by defining areas with a photoresist and reactive ion etching to form the shallow trenches. The shallow trenches are then filled with a non-reactive silicon oxide and planarized by a chemical mechanical polish. In some cases, a nitride liner, conventionally a silicon nitride, may be deposited before the oxide, so as to prevent oxidation of the surrounding areas.

Wells are then implanted in the wafer of either or both of the impurities. For example, if one begins with a p-type wafer, n-wells would be implanted. The gate oxide is grown and the various layers of the gate are deposited. A resist is then applied and the gate defined by the standard reactive ion etch method. Another resist layer is used to define the p-extensions, a lightly doped drain is formed, and the resist is removed. The same process is used to form the n-type lightly doped drain regions. The sidewall oxide or spacer is then applied and the source/drain implantation is performed. The space between the gates is then filled and the surface planarized. The aspect ratio of these gates is optimized to approach a value of 1, so that the thinner the gate layers are, the more easily filled the areas between them, the more reliable the metallization process and, hence, the more reliable the chips.

Each set of a gate, a source, a drain and a well forms a field effect transistor (FET). If the source and drain are N+, the FET is known as an NFET and, conversely, if the source and drain are P+, the FET is known as a PFET. In a single work function CMOS device, the gate is doped with a single impurity type. In a dual work function CMOS device, both NFET and PFET devices have their gate dopants tailored in order to achieve an enhanced p-channel device characteristic. This means that each time an area must be implanted with an n-type impurity, the areas that are free of impurities and the areas which are going to be doped with p-type impurities must be protected and vice versa. This leads to a multiplication of the alignment problems involved with each resist patterning step and increased throughput time because of the additional definition steps and two separate implantation steps.

This technique also suffers from limitations inherent in the conventional implantation method. Ion implantation may give rise to dislocations. The generation of dislocations provide paths for leakage of charge out of the wells that store charge in DRAM cells and across junctions. For example, normal VLSI processing conditions usually requires a high dose ion implant, such as the $BF_2$ ion implant used for p-channel source-drain (S/D) doping (in 0.5 micron technology). This may cause the formation of extended loop dislocations. Should dislocations occur, the chip fails, therefore, it is desirable to prevent the formation of these dislocations.

SUMMARY OF THE INVENTION

The present invention provides a method and an integrated circuit chip produced by the method for doping the source and drain diffusions as well as the gate polysilicon by a high temperature anneal, i.e., without using high dose ion implantation. This is accomplished by depositing a first layer of a material containing a first type of impurity, selectively removing portions of the first layer, depositing a second layer of material containing a second type of impurity and then heating to cause diffusion of the impurities into the underlying layer. As can be seen, the first layer acts as barrier layer, so the species from the second layer are diffused into the first layer and no further.

Accordingly, the need for the high dose ion implant process step is avoided, significantly reducing the possibility of dislocations and the chip failure associated with dislocations.

Another feature of the present invention is that the need for a layer of photoresist and the associated masking and processing steps are obviated. By eliminating the second photoresist step, alignment problems are not multiplied and throughput time is reduced.

The foregoing and other features and advantages of the invention will be apparent from the following more particular description of preferred embodiments of the invention, as illustrated in the accompanying drawings.

BRIEF DESCRIPTION OF THE DRAWINGS

The preferred exemplary embodiment of the present invention will hereinafter be described in conjunction with the appended drawings, where like designations denote like elements, and.

BEST MODES FOR CARRYING OUT THE INVENTION

Figure 1:
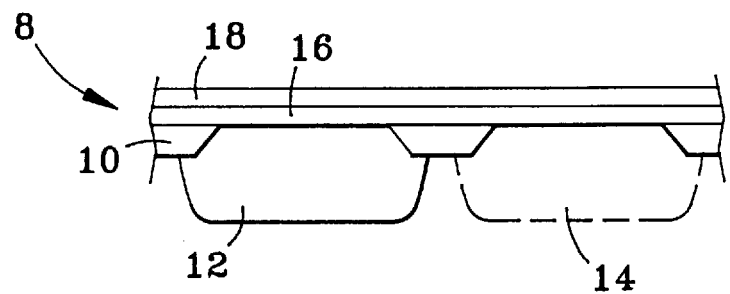
FIG. 1 is a schematic of a first step in the process of the present invention.

Referring to the FIGS. 1–6, there is shown a stepwise series of schematic views of the process and integrated circuit (IC) chip 8 of preferred embodiments of the present invention. A cross section of the IC chip 8 is shown in FIG. 1. The chip 8 itself is typically a P+ substrate, in which isolation areas may have been formed, either shallow trench isolation areas 10 or semi-recessed oxide isolation (S-ROX) structures. Between these areas, active areas are formed. The active areas commonly include n-wells 12, p-wells 14, or the doped substrate itself. The well structures 12, 14 are implanted in the usual fashion and then a gate oxide 16 is grown on the surface. On top of the gate oxide layer 16, an undoped polysilicon 18 layer is deposited to form the structure shown in FIG. 1.

Figure 2:
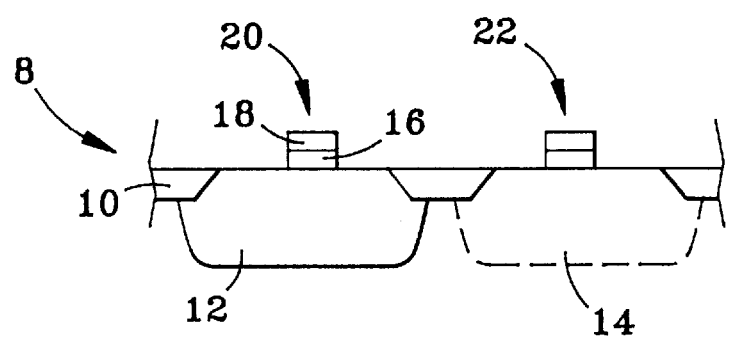
FIG. 2 is a schematic of a second step in the process of the present invention.

As shown in FIG. 2, the gates 20, 22 are defined using the conventional method, which comprises depositing a layer of a photosensitive material, known as a resist, exposing the photosensitive material to an energy source, e.g., e-beams, i-line or deep ultraviolet light, or X-rays, thereby changing the solubility of the resist so that it is either more soluble in the energy struck regions (positive resist) or less soluble in the areas the light strikes (negative resist), developing the resist, which basically comprises rinsing off the more-soluble areas, and subjecting the entire surface to a reactive ion etch process in which the areas that are not protected by a layer of resist material are etched away. Hereinafter, this entire "expose, develop, etch" process will be referred to as "defining" an area. The resist material is then removed and the resulting structure is shown in FIG. 2. The gates, 20, 22, are on the substrate surface over the active areas.

At this point, spacers 24, 26 (FIG. 6) may optionally be formed. The spacer material is deposited as a layer of an insulative material, either a nitride or an oxide depending on the device, and anisotropically reactive ion etched on the entire surface until the horizontal portions have been etched away, leaving the areas that are on the sidewalls of the gate to form the spacers 24, 26.

Figure 3:
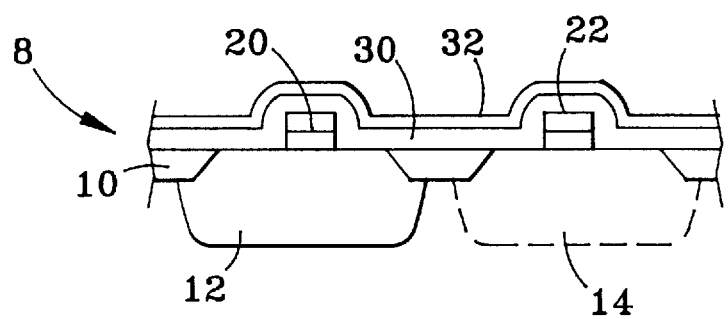
FIG. 3 is a schematic of a third step in the process of the present invention.

As shown in FIG. 3, a first layer 30 containing a first type of impurity is deposited over the entire surface. The first type of impurity may either be an n-type or a p-type impurity. If the first layer 30 contains an n-type impurity, the material is commonly either a phosphosilicate glass (PSG) or an arsenic silicate glass (ASG). The arsenic doped glass is used in place of the phosphorus doped glass because it may offer advantages, such as differences in diffusivity. If the first layer 30 contains a p-type impurity, the material is commonly borosilicate glass (BSG). In FIG. 3, the first layer 30 is BSG, i.e., a p-doped silicate glass. A nitride layer 32 or other protective layer may then, optionally, be deposited on the surface of the first layer to prevent diffusion of subsequent dopants through this first layer. If a nitride layer is not used, the thickness of the first layer 30 must controlled to prevent the diffusion of subsequent dopants through the first layer 30.

Figure 4:
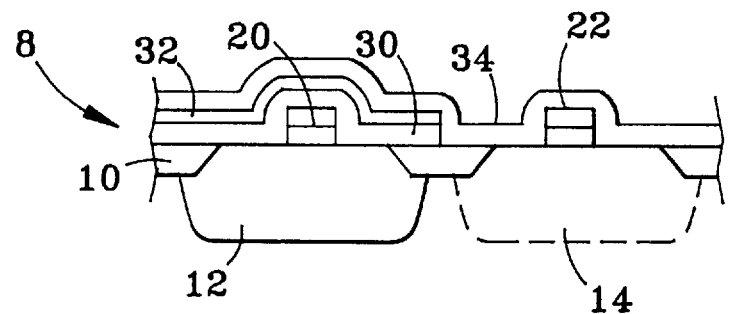
FIG. 4 is a schematic of a fourth step in the process of the present invention.

The first layer 30 is then defined, by blocking the P-channel devices with the photoresist and performing a wet etch using buffered hydrofluoric acid (BHF) to remove the BSG from the N-channel devices. Obviously, if the n-type impurity were chosen as the first layer 30, the layer would be defined so that the glass (PSG or ASG) would remain on the areas to be doped with the n-type impurity. The resist is then stripped off, the surface prepared for the next step by a reduced etch in hydrofluoric acid (HF) solution, and a second layer 34 having a second impurity is deposited on the surface, as shown in FIG. 4. This second layer 34 is again a conformal coating over the entire surface.

Figure 5:
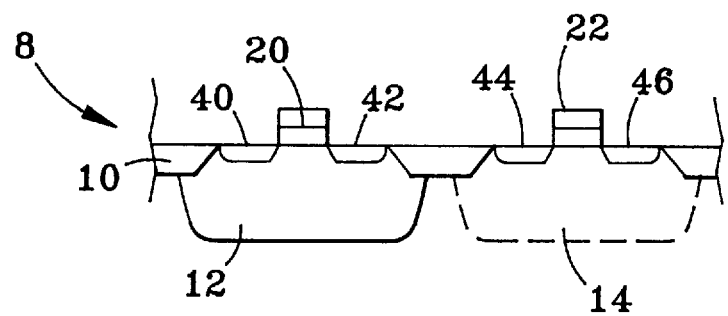
FIG. 5 is a schematic of the final product of the present invention.
Figure 6:
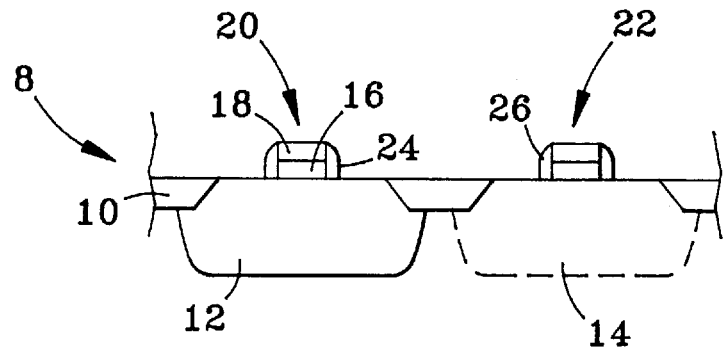
FIG. 6 is an alternative schematic of the second step in the process of the present invention.

The entire structure is then subjected to conditions necessary to perform a drive-in anneal, to arrive at the final product as shown in FIG. 5. A first source 40 and a first drain 42 having p-type impurities are formed in the n-well 12. A second source 46 and a second drain 44 having n-type impurities are formed in the p-well 14. This is preferably performed for a sub-0.1 micron($\mu$m) scale device by heating the entire structure to a temperature in the range of about 850° Celsius (C.) to about 1100° C. for approximately 10 seconds (sec.) in a rapid thermal anneal (RTA) tool. The amount of time necessary and the optimal temperature will vary depending on the device to be fabricated and the corresponding structure needed. For example, if the anneal is performed for a longer time and/or at a higher temperature, the dopant will be driven deeper into the material below and will have a more gradual concentration gradient. Conversely, as the time and/or temperature of the anneal process (DT) is reduced, the overlap of the gate is varied. In this CMOS process, the need for a spacer to define diffusion overlap is optional. In general, the DT process provides ample process window for diffusion overlap.

The gate electrode is degeneratively doped either P+ or N+ due to the rapid movement of dopant in a polycrystalline structure. The gate electrode thickness (which ultimately governs its geometric control) is now not limited by the penetration of high energy implants and can be scaled to sub-0.1 $\mu$m.

The dopant layers may then be removed and the final product may be processed using the regular back end of the line processing steps. Alternatively, the layers could be anisotropically etched to form spacers if they weren't formed previously or defining a cheaper process, such as a tetraethylorthosilicate glass spacer, to minimize diffusion and gate parasitic capacitance if a second high dose source-drain doping step is to be employed. A third option would be to not remove dopant source layers at all. The BSG/PSG (ASG) layers could remain intact on the devices if self aligned silicide were not to be employed. This would be desirable for ultra low power CMOS applications.

In another option, the use of a spun on glass (SOG) may be substituted for either or both of the BSG and PSG or ASG films. Doped SOG is commercially available with either boron, phosphorus, or arsenic and may be utilized if it is necessary or desirable because of other design and technology constraints.

As is apparent from this disclosure, dislocations are dramatically reduced or completely eliminated, because the step which typically causes dislocations, namely the high dose ion implantation step, has been replaced by a solid source diffusion step. Additionally, the gate poly and the source-drain regions of a given device are simultaneously doped with the same dopant without additional masks or costs.

While the invention has been particularly shown and described with reference to preferred exemplary embodiments thereof, it will be understood by those skilled in the art that the foregoing and other changes in form and details may be made therein without departing from the spirit and scope of the invention.

Accordingly, what is claimed is:

1. A method for forming a dual work function CMOS device comprising the steps of:
   (a) providing a substrate;
   (b) growing a gate oxide layer on the substrate surface;
   (c) depositing an undoped polysilicon layer on the gate oxide layer;
   (d) defining a plurality of gates, having sidewalls;
   (e) forming spacers on the sidewalls of the gates;
   (f) depositing a first layer containing a first type of impurity;
   (g) selectively removing portions of the first layer;
   (h) depositing a second layer containing a second type of impurity; and
   (i) heating to a temperature of about 850° C. to 1000° C. to diffuse the first and second types of impurities from the layers.

2. The method of claim 1, further comprising the steps of:
  selecting the first type of impurity from the group consisting of: n-type impurities and p-type impurities before the deposition of the first layer; and
  selecting the second type of impurity from the remaining of the n-type impurities or the p-type impurities before the deposition of the second layer.

3. The method of claim 1, further comprising the step of:
  depositing a protective layer onto the first layer, before the step of selectively removing portions of the first layer.

4. The method of claim 1, wherein the selective removal step is accomplished by the steps of:
  blocking the portions of the first layer with a photoresist material, thereby forming portions that remain and portions to be removed;
  performing a wet etch on the portions to be removed, thereby removing them;
  stripping the photoresist material from the portions that remain; and
  preparing the surface for the deposition of the second layer by a reduced etch.

5. The method of claim 1, wherein the first layer is a doped spun on glass and the second layer is an oppositely doped spun on glass.

6. A method of forming a dual work function CMOS device comprising the steps of:
  a) depositing a first layer containing a first type of impurity on an IC chip having n-wells and p-wells and defined gates for the respective wells;
  b) selectively removing portions of the first layer;
  c) depositing over the resulting substrate to be doped, a second layer containing a second type of impurity; and
  d) heating the resulting substrate at a temperature which is sufficient to effect the diffusion of the first and second types of impurities from the layers and into the adjacent areas.

7. The method of claim 6, wherein the selectively removing steps comprise:
  e) blocking portions of the first layer with a photoresist material, thereby forming first portions and second portions;
  f) removing the second portions by wet etching;
  g) stripping the photoresist material from the first portions; and
  h) treating the surface of the resulting substrate with an etching reagent to provide for the deposition of the second layer.

8. The method of claim 6, further comprising the steps of:
  before the step of depositing the first layer, selecting the first type of impurity from the group consisting of: n-type impurities and p-type impurities; and
  before the step of depositing the second layer, selecting the second type of impurity from the remaining of the n-type impurities or the p-type impurities.

9. The method of claim 6, further comprising the step of:
  depositing a protective layer onto the first layer, before the step of selectively removing portions of the first layer.

10. The method of claim 6, wherein the heating to diffuse the first and second types of impurities from the layers is carried out by heating to a temperature of about 850° C. to about 1100° C.

11. The method of claim 6, wherein the first layer is a doped spun on glass and the second layer is an oppositely doped spun on glass.

12. The method of claim 6, further comprising the step of:
  removing the first layer and the second layer.

13. The method of claim 6, further comprising the step of:
  anisotropically etching the first layer and the second layer, thereby forming a sidewall spacer.

* * * * *